United States Patent [19]

Yoshida

[11] Patent Number: 5,349,557
[45] Date of Patent: Sep. 20, 1994

[54] SEMICONDUCTOR MEMORY DEVICE

[75] Inventor: Makoto Yoshida, Nara, Japan

[73] Assignee: Sharp Kabushiki Kaisha, Osaka, Japan

[21] Appl. No.: 109,329

[22] Filed: Aug. 19, 1993

[30] Foreign Application Priority Data

Aug. 25, 1992 [JP]  Japan .................. 4-226102

[51] Int. Cl.⁵ .............................................. G11C 7/00
[52] U.S. Cl. .................... 365/200; 365/189.11; 365/190
[58] Field of Search .............. 365/189.11, 200, 206, 365/230.06, 190, 203, 189.01

[56] References Cited

U.S. PATENT DOCUMENTS

| | | | |
|---|---|---|---|
| 4,829,477 | 5/1989 | Suzuki et al. | 365/189.06 |
| 4,939,693 | 7/1990 | Tran | 365/190 |
| 4,961,168 | 10/1990 | Tran | 365/189.11 |
| 5,274,594 | 12/1993 | Yanagisawa et al. | 365/200 |

FOREIGN PATENT DOCUMENTS

59-201298 11/1984 Japan .

*Primary Examiner*—Eugene R. LaRoche
*Assistant Examiner*—Son Dinh
*Attorney, Agent, or Firm*—Morrison & Foerster

[57] ABSTRACT

A semiconductor memory device having an array of memory cells divided into a plurality of blocks including a redundant block, in which each block is treated as a single unit and a faulty block is replaced with the redundant block. Each block has four logic circuits which drives a transistor for pulling up bits lines in a standby state and drives a transistor for pulling up bit lines to prevent data from being lost according to a bit-line pull-up timing signal, a redundant-block enable signal, a block address and a write signal. With this structure, in a faulty block, both of the transistors are always turned off and a supply of currents to the bit lines are cut off. Therefore, even when a block becomes faulty due to a short circuit between the bit lines and the ground potential section, the semiconductor memory device is saved from becoming defective.

35 Claims, 6 Drawing Sheets

FIG. 7

SEMICONDUCTOR MEMORY DEVICE

FIELD OF THE INVENTION

The present invention relates to a semiconductor memory device having an array of memory cells, arranged as a matrix and divided into a plurality of blocks including a redundant block, in which each block is treated as a single unit and a faulty block is replaced with the redundant block.

BACKGROUND OF THE INVENTION

Figure 8:
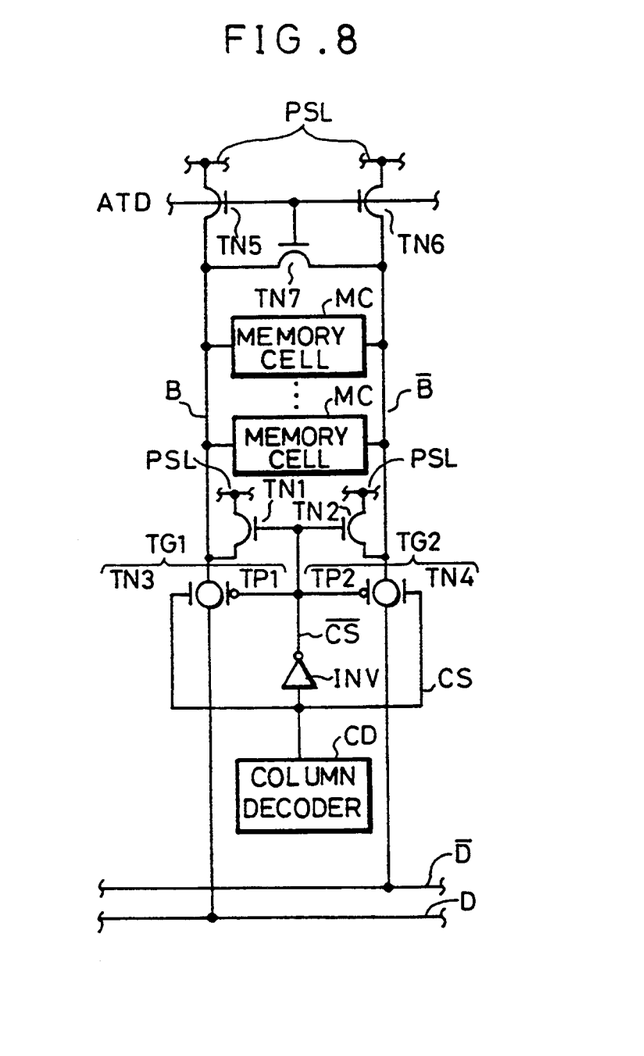
FIG. 8 is an electronic circuit diagram illustrating the structure of a column in a conventional semiconductor memory device.

FIG. 8 is a circuit diagram of a semiconductor memory device including conventional static memory cells MC. The semiconductor memory device of this type employs memory cells MC having the structure shown in FIG. 3, 4 or 5.

Figure 3:
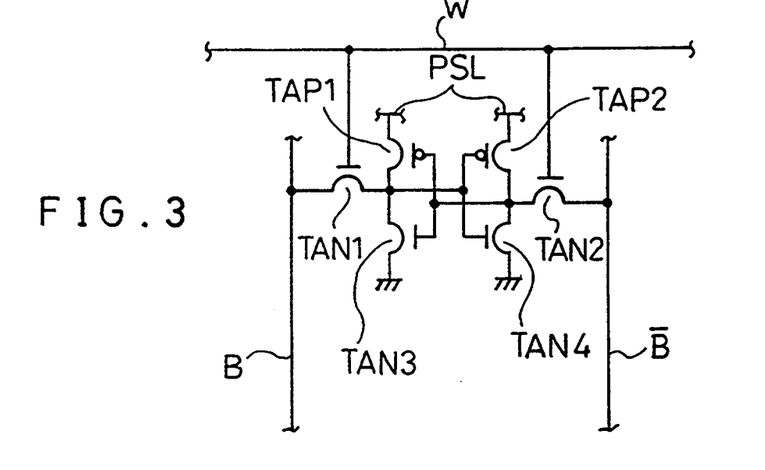
FIG. 3 is an electronic circuit diagram illustrating the structure of a memory cell.

The memory cell MC of FIG. 3 has access transistors (N channel) TAN1 and TAN2, drive transistors (N channel) TAN3 and TAN4, and load transistors (P channel) TAP1 and TAP2.

Figure 4:
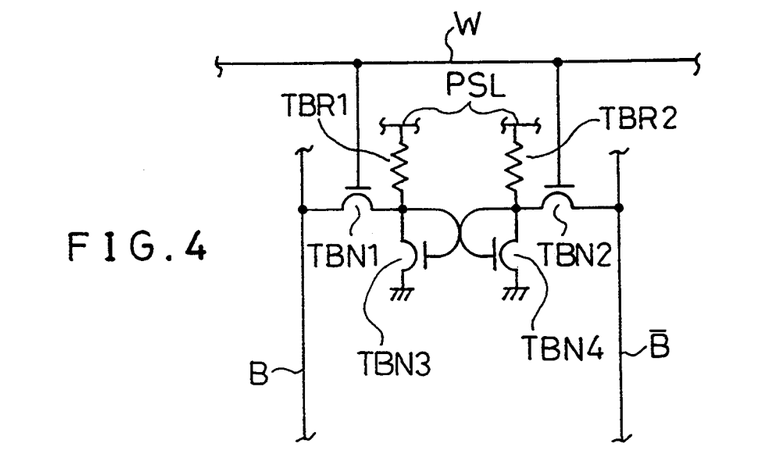
FIG. 4 is an electronic circuit diagram illustrating the structure of another memory cell.

The memory cell MC of FIG. 4 is of a load resistor type, and has access transistors (N channel) TBN1 and TBN2, drive transistors (N channel) TBN3 and TBN4, and load resistors TBP1 and TBP2.

Figure 5:
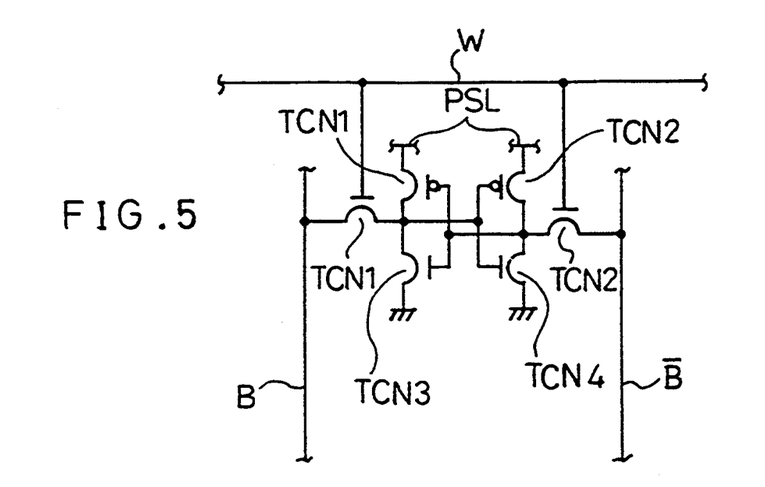
FIG. 5 is an electronic circuit diagram illustrating the structure of still another memory cell.

The memory cell MC of FIG. 5 has access transistors (N channel) TCN1 and TCN2, drive transistors (N channel) TCN3 and TCN4, and load thin-film transistors (P channel) TCP1 and TCP2.

As illustrated in FIG. 8, each column in the semiconductor memory device includes a pair of bit lines B and $\overline{B}$, transistors (N channel) TN5, TN6 and TN7 for pulling up the bit lines B and $\overline{B}$ in a standby state, transistors (N channel) TN1 and TN2 for preventing stored data from being lost when writing data, a column decoder CD and an inverter INV, CMOS transfer gates TG1 and TG2 for selecting a column. The CMOS transfer gate TG1 includes an MOS transistor (N channel) TN3 and an MOS transistor (P channel) TP1. The CMOS transfer gate TG2 includes an MOS transistor (N channel) TN4 and an MOS transistor (P channel) TP2.

One end of the bit line B and of the bit line $\overline{B}$ are connected to a data lines D and $\overline{D}$ through the CMOS transfer gate TG1 and TG2, respectively. The other end of the bit line B and of the bit line $\overline{B}$ are connected to power supply lines PSL through the transistors TN5 and TN6, respectively. The bit line B and the bit line $\overline{B}$ are connected with the transistor TN7 and a plurality of memory cells.

The output of the column decoder DC goes high only when its own column address is input. The high state of the output turns on the CMOS transfer gates TG1 and TG2.

In a conventional semiconductor memory device, in a column other than a selected column, a line $\overline{CS}$ connected to the output terminal of the inverter INV goes high, and the transistors TN1 and TN2 are turned on. When a write operation is started on the selected column, the bit line of the column is caused to make a big swing (i.e., the voltage level is changed significantly) by a write signal supplied by a write driver (not shown). Since the capacity between bit lines becomes larger, noise appears in the bit lines of adjacent unselected columns.

At this time, the bit lines B and $\overline{B}$ of the unselected columns go high. The reason for this is that a voltage is applied from the power source to the bit lines B and $\overline{B}$ of the unselected columns via the load elements (load transistors TAP1 and TAP2, the load resistors TBP1 and TBP2, or the load thin-film transistors TCP1 and TCP2) in the memory cells MC and the transistors TN1 and TN2.

The voltage level supplied from the memory cells MC to the bit lines B and $\overline{B}$ of the unselected columns is relatively low because of a voltage drop caused by the load elements in the memory cells MC. Therefore, the voltage level of the bit lines B and $\overline{B}$ of the unselected columns is raised by supplying a source voltage to the bit lines B and $\overline{B}$ of the unselected columns via the transistors TN1 and TN2. This arrangement restrains an increase in the amount of noise occurred in the bit lines B and $\overline{B}$ of the unselected columns during a write operation, preventing the data stored in the memory cells from being lost.

To restrain power consumption (i.e., leakage of direct currents), the driving power (the value of drain current) of the transistors TN1 and TN2 is arranged to be much lower than that of the drive transistors (TAN3 and TAN4, TBN3 and TBN4, or TCN3 and TCN4) in the memory cells MC.

In order to allow the write driver to properly perform its operation, the line ATD connected to the respective gates of the transistors TN5, TN6 and TN7 is kept low, and the transistors TN5, TN6 and TN7 is kept off.

In recent years, to increase the capacity of semiconductor devices, the devices have finer patterns. And, the rate of fault occurring in the bit lines increases. One type of common faults is a short circuit between bit lines. Another types of faults are bit lines fixed to the power source potential caused by a short circuit between the bit line and a power supply line, and bit lines fixed to a ground potential caused by a short circuit between the bit lines and the ground potential section.

In order to cope with such a fault, with a prior art, a single chip is divided into a plurality of blocks and a block having a fault (hereinafter referred to as a faulty block) is replaced with a redundant block. More specifically, when a fault is detected in a product test, the transistors TN5, TN6 and TN7 in the faulty block are turned off, and a redundant block is used instead of the faulty block. This allows semiconductor memory devices having faults to be corrected.

However, with a conventional structure, the transistors TN1 and TN2 are on in a standby state and a direct current path from the power source potential to the ground potential is produced, thereby increasing the leakage direct currents. It is therefore impossible to fully correct a semiconductor memory device having a fault caused by a short circuit between bit lines and a ground potential section.

Moreover, in the semiconductor memory device, if the transistors TN1 and TN2 are removed, the amount of noise occurring in the bit lines B and $\overline{B}$ of an unselected column increases during a write operation, causing the data stored in the memory cell to be lost.

In order to prevent such a drawback, the transistors TN1 and TN2 may be arranged to be turned on only when a block on which a write or read operation is to be performed is selected. However, this structure causes an error during the read operation. Namely, in the selected block, the transistors TN1 and TN2 are turned on and the bit lines B and $\overline{B}$ go high. This causes the potential difference between the bit lines B and $\overline{B}$ to be diminished when reading out data, preventing the data from being properly read.

SUMMARY OF THE INVENTION

It is an object of the present invention to provide a semiconductor memory device capable of preventing a short circuit between bit lines and a ground potential section from causing a fault in the device.

To achieve the above object, a semiconductor memory device of the present invention includes:

a plurality of memory cells for storing data;

at least one redundant block having strings of the memory cells arranged in a predetermined direction; and a plurality of regular blocks having strings of the memory cells arranged in the predetermined direction, wherein, when there is a faulty block among the regular blocks, the redundant block is used instead of the faulty block, and wherein each string of the memory cells in the regular blocks includes:

a pair of bit lines, connected to a plurality of the memory cells, for transmitting signals read out from the memory cells and signals to write data in the memory cells;

first pull-up switching means for starting or stopping pulling-up of the bit lines; and second pull-up switching means for starting or stopping pulling-up of the bit lines to prevent data stored in the memory cells from being lost, the semiconductor memory device further including:

first driving means for driving the first pull-up switching means so that the first pull-up switching means in a faulty regular block is always turned off and that the first pull-up switching means in a normal regular block is turned on in a standby state and turned off when reading or writing data; and second driving means for driving the second pull-up switching means so that the second pull-up switching means in a faulty regular block is always turned off, and that the second pull-up switching means in a selected string of the memory cells in a normal regular block is turned off and the second pull-up switching means in an unselected string of the memory cells in the normal regular block is turned on when reading or writing data.

With this structure, in the faulty block, both of the first pull-up switching means and the second pull-up switching means are turned off, and a supply of currents to the bit lines are cut off. Therefore, even when a fault develops in a block due to a short circuit between the bit lines and the ground potential section, the semiconductor memory device is saved from becoming defective.

On the other hand, in a normal regular block, the first pull-up switching means is turned off and only the second pull-up switching means in an unselected string of the memory cells is turned on when the semiconductor memory device operates (i.e., during read and write operations). Therefore, the bit lines of the unselected string of the memory cells are pulled up. This structure restrains an increase in the amount of noise appearing in the bit lines of the unselected string of the memory cells when writing data, thereby preventing the data stored in the memory cell from being lost. At this time, since the second pull-up switching means in the selected string of the memory cells is turned off, the bit lines of the selected string of the memory cells are not pulled up. Consequently, only a voltage of a signal read out from a memory cell is applied to the bit lines of the selected string of the memory cells. Since there is a potential difference sufficient for reading out data between the bit lines, a read operation is properly performed.

In addition, to achieve the above object, a semiconductor memory device of the present invention includes:

a plurality of memory cells for storing data;

at least one redundant block having strings of the memory cells arranged in a predetermined direction; and a plurality of regular blocks having strings of the memory cells arranged in the predetermined direction, wherein, when there is a faulty block among the regular blocks, the redundant block is used instead of the faulty block, and wherein each string of the memory cells in the regular blocks includes:

a pair of bit lines, connected to a plurality of the memory cells, for transmitting signals read out from the memory cells and signals to write data in the memory cells;

first pull-up switching means for starting or stopping pulling-up of the bit line; and second pull-up switching means for starting or stopping pulling-up of the bit lines to prevent data stored in the memory cells from being lost, the semiconductor memory device further including:

third driving means for driving the first pull-up switching means so that the first pull-up switching means in a faulty block among the regular blocks is always turned off, and that the first pull-up switching means in a normal block among the regular blocks is turned on in a standby state and turned off when reading or writing data; and fourth driving means for driving the second pull-up switching means so that the second pull-up switching means in a faulty regular block is always turned off, the second pull-up switching means in a normal regular block is turned off in a standby state or in reading out data, and that the second pull-up switching means in a selected normal block is turned on and the second pull-up switching means in an unselected normal block is turned off when writing data.

With this structure, in the faulty block, both of the first pull-up switching means and the second pull-up switching means are turned off, and therefore a supply of currents to the bit lines are cut off. Thus, even when a block becomes faulty due to a short circuit between the bit lines and the ground potential section, the semiconductor memory device is saved from becoming defective.

On the other hand, in a normal block, since the first pull-up switching means and the second pull-up switching means are both turned off when reading out data, the bit lines are not pulled up. Therefore, only the voltage of the signal read out from a memory cell is applied to the bit lines of a selected string of memory cells, and a potential difference sufficient for reading out data appears between the bit lines. Namely, the read operation is not affected. Meanwhile, when writing data, the first pull-up switching means is turned off and only the second pull-up switching means in the selected block is turned on. Consequently, the bit lines of the selected block are pulled up. With this structure, it is possible to restrain an increase in the amount of noise on the bit lines of an unselected string of the memory cells in the selected block when writing data, preventing the data stored in the memory cells from being lost.

For a fuller understanding of the nature and advantages of the invention, reference should be made to the ensuing detailed description taken in conjunction with the accompanying drawings.

DESCRIPTION OF THE EMBODIMENTS

[EMBODIMENT 1]

The following description discusses a first embodiment of the present invention with reference to FIGS. 1 to 5.

All of the logic circuits (NOR gates, INHIBIT NAND gates, and inverters) shown in this embodiments are for use with positive logic.

Figure 1:
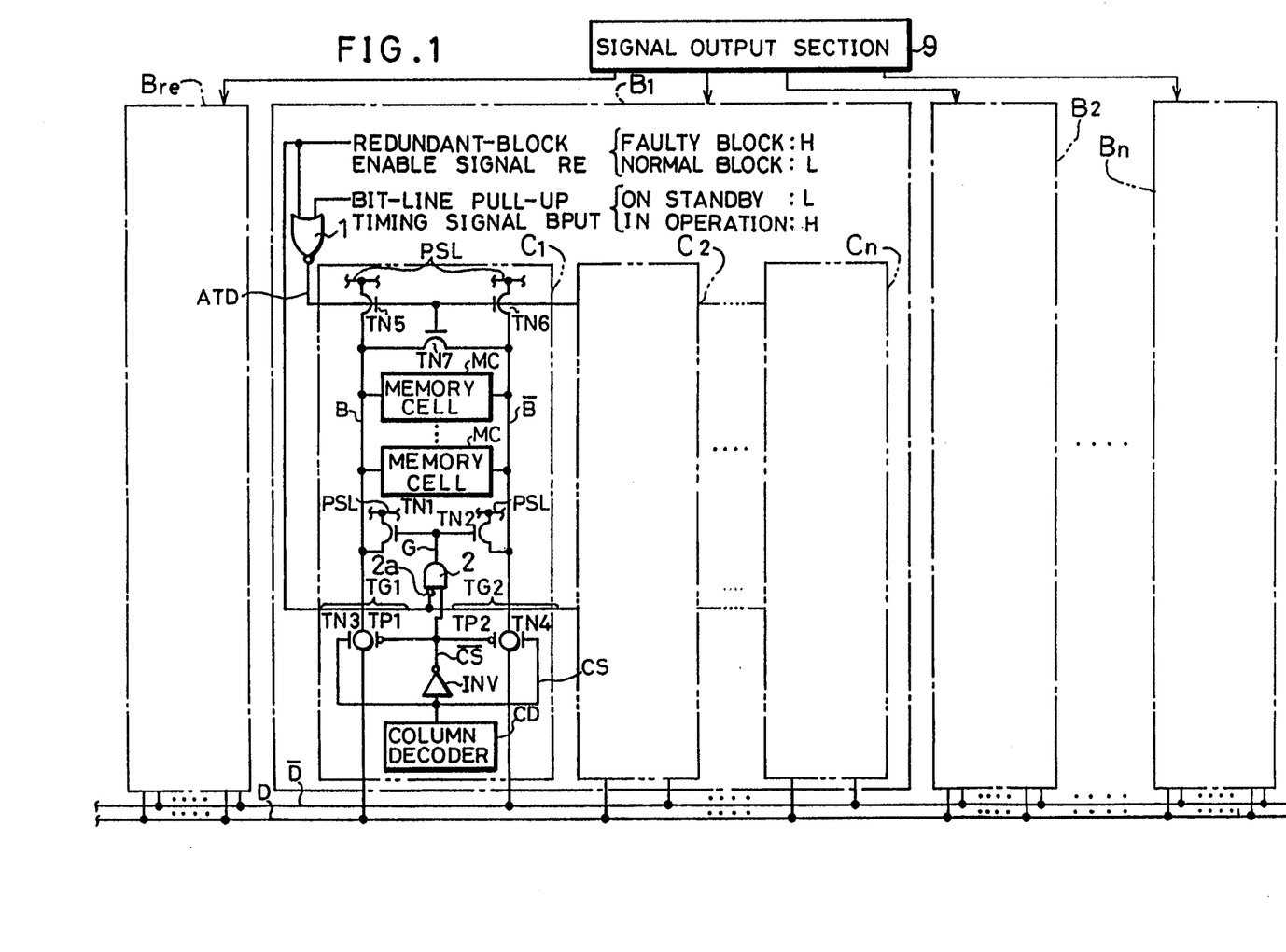
FIG. 1 is an electronic circuit diagram illustrating the structure of regular blocks in a semiconductor memory device according to a first embodiment of the present invention.

As illustrated in FIG. 1, a semiconductor memory device of this embodiment has an array of memory cells, arranged as a matrix and divided into a plurality of blocks including a redundant block $B_{re}$ and regular blocks $B_1$ to $B_m$, in which each block is treated as a single unit and a faulty block is replaced with the redundant block $B_{re}$. More specifically, a product test is given to a complete semiconductor memory device so as to detect if there is a fault in the regular blocks $B_1$ to $B_m$. The redundant block $B_{re}$ takes over a faulty block.

The semiconductor memory device has a signal outputting section 9 (pull-up timing signal outputting means and redundant-block enable signal outputting means) for transmitting to blocks various signals including a block address for selecting a block, a bit-line pull-up timing signal BPUT for pulling up bit lines and a redundant-block enable signal RE, to be described later.

Since all of the regular blocks $B_1$ to $B_m$ have the same structure, only the description of the block $B_1$ is given here.

The block $B_1$ includes a plurality of columns (strings of memory cells) $C_1$ to $C_n$, and a NOR gate 1 (first driving means, first drive signal generating means, and a first logic circuit). All of the columns $C_1$ to $C_m$ have the same structure, and therefore only the description of the column $C_1$ is given here.

The column $C_1$ includes a plurality of memory cells MC arranged in a vertical direction, a pair of bit lines B and $\bar{B}$, transistors (N channel) TN5, TN6 and TN7 (first pull-up switching means) for pulling up the bit lines B and $\bar{B}$ in a standby state, transistors (N channel) TN1 and TN2 (second pull-up switching means, and a third switching element) for preventing stored data from being lost during write operation, an INHIBIT NAND gate 2 (second driving means, second drive signal generating means, and a second logic circuit), a column decoder CD and an inverter INV, CMOS transfer gates TG1 and TG2 for selecting a column.

This semiconductor memory device uses static type memory cells MC shown in FIGS. 3 to 5.

The memory cell MC of FIG. 3 includes access transistors (N channel) TAN1 and TAN2, drive transistors (N channel) TAN3 and TAN4, and load transistors (P channel) TAP1 and TAP2. The load transistors TAP1 and TAP 2 are respectively connected to a power supply line PSL. The access transistors TAN1 and TAN2 are connected to the lines B and $\bar{B}$, respectively. The gates of the access transistors TAN1 and TAN2 are respectively connected to a word line W. During the reading or writing of data, when the word line W is selected and becomes high, the transistors TAN1 and TAN2 are turned on. This allows reading of data from the memory cell or writing data in the memory cell MC.

The memory cell MC of FIG. 4 is of a load resistor type, and has access transistors (N channel) TBN1 and TBN2, drive transistors (N channel) TBN3 and TBN4, and load resistors TBP1 and TBP2. The load transistors TBP1 and TBP 2 are respectively connected to the power supply line PSL. The access transistors TBN1 and TBN2 are connected to a lines B and $\bar{B}$, respectively. The gates of the access transistors TBN1 and TBN2 are respectively connected to a word line W. During the reading or writing of data, when the word line W is selected and becomes high, the transistors TBN1 and TBN2 are turned on. This allows reading of data from the memory cell or writing of data in the memory cell MC.

The memory cell MC of FIG. 5 has access transistors (N channel) TCN1 and TCN2, drive transistors (N channel) TCN3 and TCN4, and load thin-film transistors (P channel) TCP1 and TCP2. The load thin-film transistors TCP1 and TCP 2 are respectively connected to the power supply line PSL. The access transistors TCN1 and TCN2 are connected to a lines B and $\bar{B}$, respectively. The gates of the access transistors TCN1 and TCN2 are respectively connected to a word line W. During the reading or writing of data, when the word line W is selected and becomes high, the transistors TCN1 and TCN2 are turned on. This allows reading of data from the memory cell or writing of data in the memory cell MC.

One end of the bit line B and of the bit line $\bar{B}$ are connected to data lines D and $\bar{D}$ through CMOS transfer gates TG1 and TG2 for selecting a column, respectively. The other end of the bit line B and of the bit line $\bar{B}$ are connected to power supply lines PSL through the transistors TN5 and TN6 (the first switching elements), respectively. The bit line B and of the bit line $\bar{B}$ are connected with the transistor TN7 (the second switching element) and a plurality of memory cells MC.

A pair of the bit lines B and $\bar{B}$ are connected to a plurality of memory cells MC, and transmits complimentary signals read from the memory cells MC to the data lines D and $\bar{D}$ and signals from a write driver 10 to the memory cells MC so as to write data.

The output of the column decoder DC goes high only when its own column address is input. When the output becomes high, the CMOS transfer gates TG1 and TG2 are driven.

The inverter INV is connected to the output terminal of the column decoder CD, inverts an input signal from the column decoder CD and outputs a signal $\overline{CS}$ of inverted level. The signal $\overline{CS}$ (a timing signal for selecting a string of memory cells) is input to the INHIBIT NAND circuit 2. The column decoder CD and the inverter INV form timing signal outputting means for selecting a string of memory cells.

The transfer gate CMOS TG1 includes an MOS transistor (N channel) TN3 and an MOS transistor (P channel) TP1. When the output of the column decoder CD is high, the CMOS transfer gate TG1 becomes on and connects the bit line B to the data line D. On the other hand, when the output of the column decoder CD is low, the CMOS transfer gate TG1 becomes off and disconnects the bit line B and the data line D.

The CMOS transfer gate TG2 includes an MOS transistor (N channel) TN4 and an MOS transistor (P channel) TP2. When the output of the column decoder CD is high, the CMOS transfer gate TG2 becomes on and connects the bit line $\overline{B}$ to the data line $\overline{D}$. On the other hand, when the output of the column decoder CD is low, the CMOS transfer gate TG2 becomes off and disconnects the bit line bar $\overline{B}$ and the data line $\overline{D}$.

The NOR gate 1 receives the timing signal BPUT and the redundant-block enable signal RE, and outputs a gate signal ATD (first drive signal) to the transistors TN5, TN6, TN7. The NOR gate 1 is a logic circuit which outputs the high state (second level) of the gate signal ATD only when both the timing signal BPUT and the redundant-block enable signal RE are low (first level). The gate signal ATD from the NOR gate 1 is supplied to the transistors TN5, TN6, and TN7 in the blocks $B_1$ to $B_m$.

The timing signal BPUT goes low when the semiconductor memory device is in a standby state, and switches to high when the semiconductor memory device operates.

After testing a complete product, the redundant-block enable signal RE is set so that it becomes high if the block $B_1$ is faulty and it becomes low if the block $B_1$ has no fault.

The INHIBIT NAND circuit 2 is a logic circuit which receives the redundant-block enable signal RE and the output signal $\overline{CS}$ of the inverter INV, and which outputs a gate signal G (second drive signal) to the transistors TN1 and TN2 for pulling up the bit lines to prevent data from being lost. The redundant-block enable signal RE is input to the logical inverted input terminal of the INHIBIT NAND circuit 2. Then, the INHIBIT NAND circuit 2 outputs the high state of the gate signal G only when the redundant-block enable signal RE is low and the signal $\overline{CS}$ is high.

Figure 2:
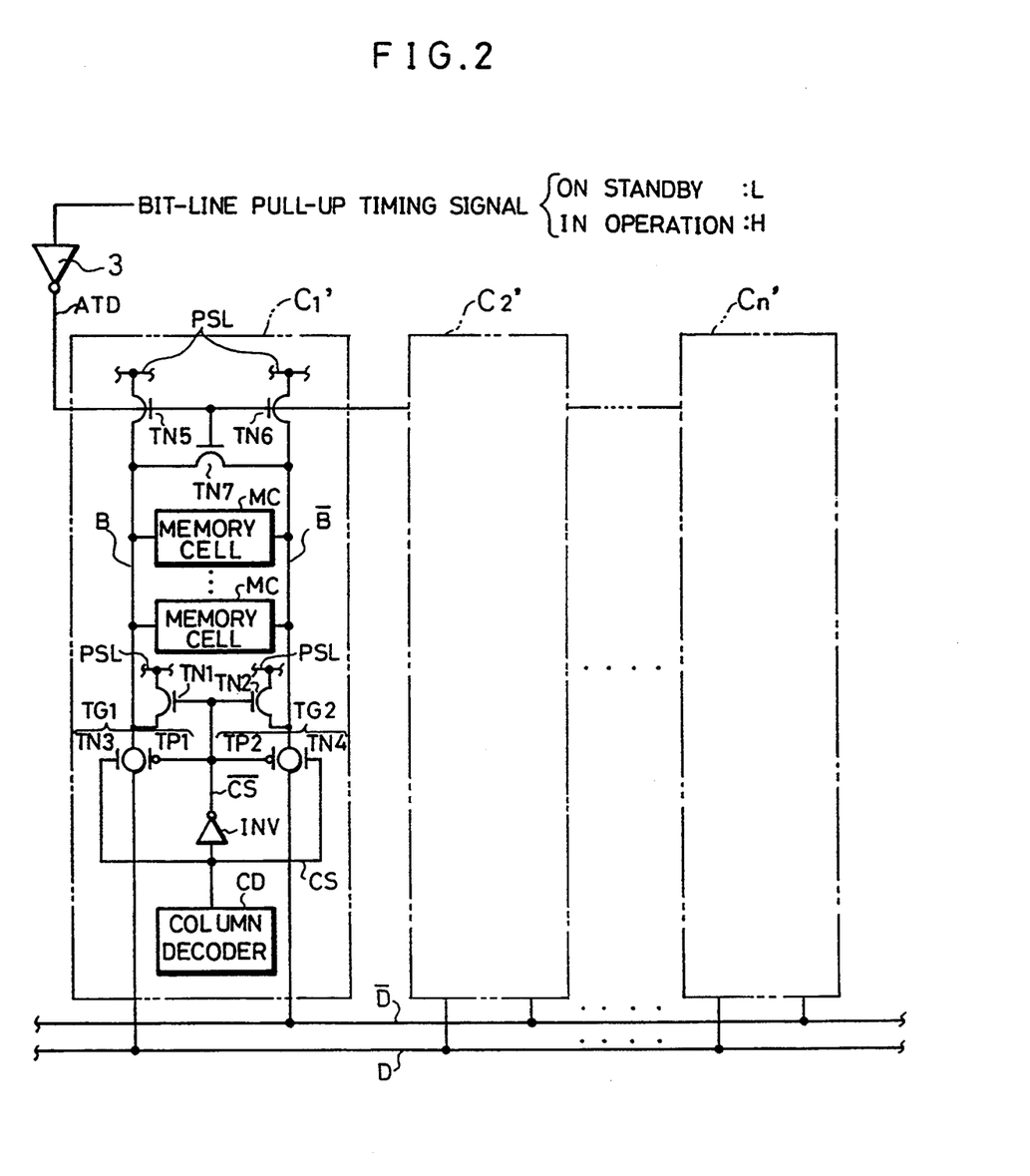
FIG. 2 is an electronic circuit diagram illustrating the structure of a redundant block in the semiconductor memory device.

FIG. 2 illustrates the structure of the redundant block $B_{re}$. The redundant block $B_{re}$ includes a plurality of columns $C_1'$ to $C_n'$, and an inverter 3. The columns $C_1'$ to $C_n'$ do not include the INHIBIT NAND gate that is used in the columns $C_1$ to $C_n$ of the blocks $B_1$ to $B_m$. The transistors TN1 and TN2 are switched between on and off by the output signal $\overline{CS}$ of the inverter INV, and the transistors TN5, TN6 and TN7 are switched between on and off by the gate signal ATD output from the inverter 3. Except for these differences, the structure of the columns $C_1'$ to $C_n'$ have the same structure as that of the columns $C_1$ to $C_n$, and therefore a detail description is omitted.

The inverter 3 is a logic circuit which inverts an input signal and outputs a signal inverted level. The inverter 3 receives the timing signal BPUT and outputs the gate signal ATD to the transistors TN5, TN6 and TN7 in the columns $C_1'$ to $C_n'$.

The following description explains a case where a faulty block exists among the regular blocks $B_1$ and $B_m$ of the above-mentioned structure.

In this case, the high state of the redundant-block enable signal RE is always input to the faulty block and the low state of the redundant-block enable signal RE is always input to other regular blocks.

In the faulty block, since the high state of the redundant-block enable signal is always input to the NOR gate 1 and INHIBIT NAND gate 2, the gate signal ATD and the gate signal G are always low irrespective of the states of the timing signal BPUT and the output signal $\overline{CS}$ of the inverter INV. Then, transistors TN5, TN6 and TN7 (for pulling up the bit lines in a standby state) and transistors TN1 and TN2 (for pulling up the bit lines to prevent data from being lost) always become off, cutting off a supply of currents to the bit lines B and $\overline{B}$. With this structure, even when such a fault develops as a result of a short circuit between the bit lines B and $\overline{B}$ and ground potential section, the semiconductor memory device is saved from becoming defective.

The following description explains a normal block. In the normal block, the low state of the redundant-block enable signal RE is always input to the NOR gate 1 and INHIBIT NAND gate 2.

When the semiconductor memory device is on standby, the low state of the timing signal BPUT is input to the respective blocks, and therefore the gate signal ATD output from the NOR gate 1 is high. As a result, the transistors TN5, TN6 and TN7 in the columns $C_1$ to $C_n$ are turned on, and the bit lines B and $\overline{B}$ are pulled up. At this time, the signal CS output from the column decoder CD of each of the columns $C_1$ to $C_n$ is low, and therefore the output signal $\overline{CS}$ of the inverter INC becomes high. Consequently, the gate signal G output from the INHIBIT NAND gate 2 goes high, and the transistors TN1 and TN2 are turned on.

When the semiconductor memory device operates (i.e., during write or read operation), the high state of the timing signal BPUT is input to each block. Therefore, the gate signal ATD output from the NOR gate 1 becomes low, and the transistors TN5, TN6 and TN7 in each of the columns $C_1$ to $C_n$ are turned off.

In an unselected column, the column decoder CD outputs the low state of the signal CS. This signal causes the gate signal G to go high, and the transistors TN1 and TN2 to be turned on so as to pull up the bit lines B and $\overline{B}$. This structure restrains an increase in the amount of noise appearing in the bit lines B and $\overline{B}$ of the unselected column when writing data, and prevents the data stored in the memory cells MC from being lost.

On the other hand, in a selected column, the column decoder CD outputs the high state of the signal CS. This signal causes the gate signal G to go low, and the transistors TN1 and TN2 to be turned off. In a read operation, a voltage is applied to the bit lines B and $\overline{B}$ in the selected column only from a selected memory cell MC. As a result, a potential difference sufficient for reading out data appears in the bit lines B and $\overline{B}$ of the selected column.

To restrain the consumption of power (leakage of direct currents), the driving power (the value of a drain current) of the transistors TN1 and TN2 is considerably lower than that of the drive transistors (TAN3 and TAN4, TBN3 and TBN4, or TCN3 and TCN4) in the memory cells MC.

As described above, the semiconductor memory device of this embodiment includes:

a plurality of memory cells for storing data;

at least one redundant block having strings of the memory cells arranged in a predetermined direction; and a plurality of regular blocks having strings of the memory cells arranged in the predetermined direction, wherein, when there is a faulty block among the regular blocks, the redundant block is used instead of the faulty block, and wherein each string of the memory cells in the regular blocks includes:

a pair of bit lines, connected to a plurality of the memory cells, for transmitting signals read from the memory cells and signals to write data in the memory cells;

first pull-up switching means for starting or stopping pulling-up of the bit lines; and second pull-up switching means for starting or stopping pulling-up of the bit lines to prevent data stored in the memory cells from being lost, the semiconductor memory device further including:

first driving means for driving the first pull-up switching means so that the first pull-up switching means in a faulty regular blocks is always turned off and that the first pull-up switching means in a normal regular block is turned on in a standby state and turned off when reading or writing data; and second driving means for driving the second pull-up switching means so that the second pull-up switching means in a faulty regular block is always turned off, and that the second pull-up switching means in a selected string of the memory cells in a normal regular block is turned off and the second pull-up switching means in an unselected string of the memory cells in the normal regular block is turned on when reading or writing data.

With this structure, in the faulty block, both of the first pull-up switching means and the second pull-up switching means are turned off, and a supply of currents to the bit lines are cut off. Therefore, even when a fault develops in a block due to a short circuit between the bit lines and the ground potential section, the semiconductor memory device is saved from becoming defective.

On the other hand, in the normal blocks, the bit lines in an unselected string of the memory cells are pulled up when the semiconductor memory device operates (i.e., during read and write operations). This structure restrains an increase in the amount of noise appearing in the bit lines of the unselected string of the memory cells when writing data, thereby preventing the data stored in the memory cell from being lost. At this time, the bit lines of a selected string of the memory cells are not pulled up. Consequently, only a voltage of a signal read from the memory cell is applied to the bit lines of the selected string of the memory cells. Since there is a potential difference sufficient for reading out data between the bit lines, a read operation is properly performed.

[EMBODIMENT 2]

The following description discusses a second embodiment of the present invention with reference to FIGS. 3 to 7.

The members having the same structure or function as in the above-mentioned embodiment will be designated by the same code and their description will be omitted. All of the logic circuits (AND gate, NAND gate, NOR gate, and inverter) shown in this embodiment are for use with positive logic.

Figure 6:
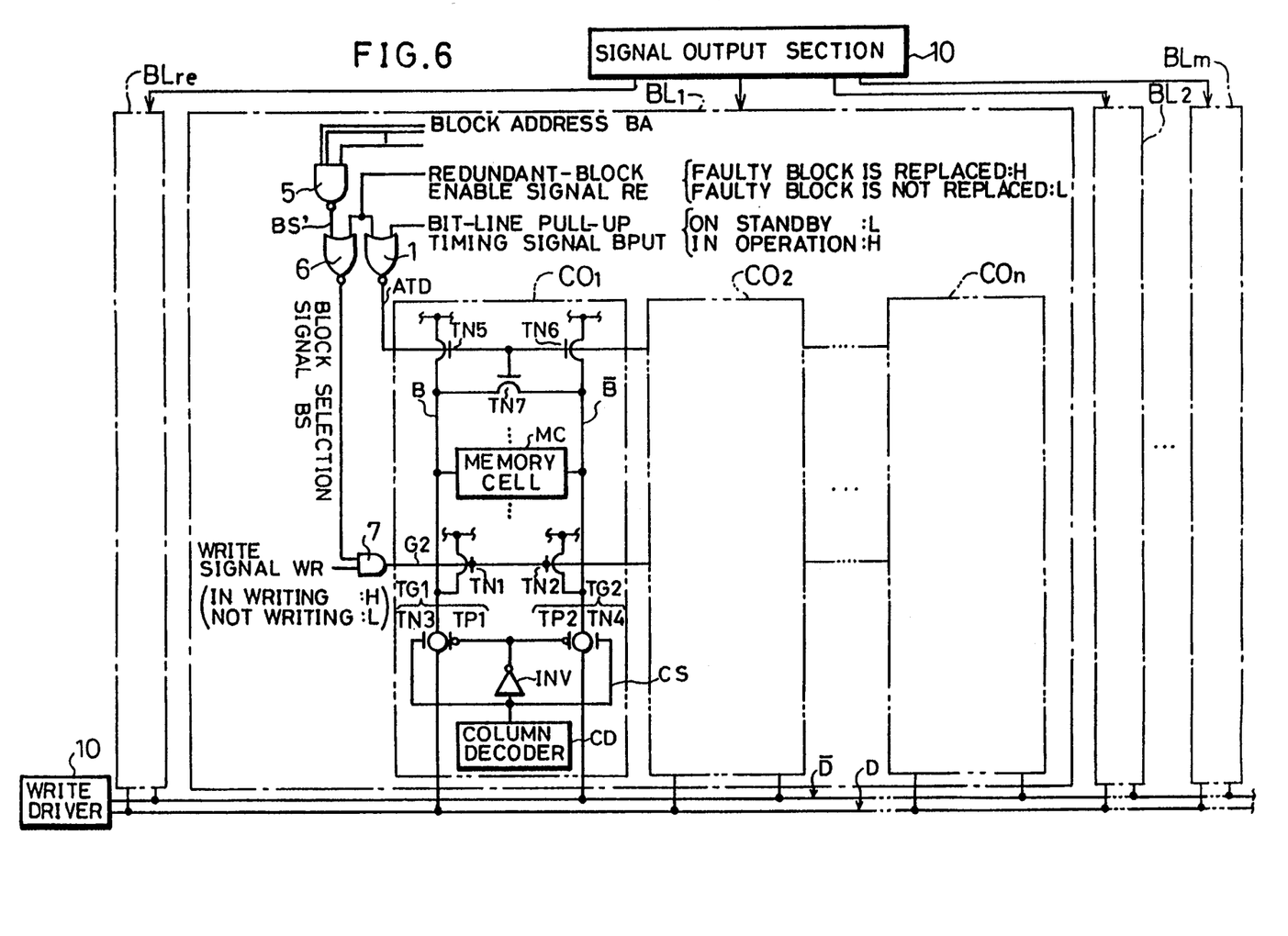
FIG. 6 is an electronic circuit diagram illustrating the structure of regular blocks in a semiconductor memory device according to a second embodiment of the present invention.

As illustrated in FIG. 6, as is similar to the first embodiment, a semiconductor memory device of this embodiment has an array of memory cells, arranged as a matrix and divided into a plurality of blocks including a redundant block $BL_{re}$ and regular blocks $BL_1$ to $BU_m$, in which each block is treated as a single unit and a faulty block is replaced with the redundant block $BL_{re}$.

The semiconductor memory device has a signal outputting section 10 (block-address outputting means, pull-up timing signal outputting means, redundant-block enable signal outputting means, and write signal outputting means) for transmitting to blocks various signals including a block address BA of a block to be selected, a bit-line pull-up timing signal BPUT for pulling up bit lines, a redundant-block enable signal RE and a write signal WR, to be described later.

Since all of the regular blocks $BL_1$ to $BU_m$ have the same structure, only the description of the block $BL_1$ is given here.

The block $BL_1$ includes a plurality of columns (strings of memory cells) $CO_1$ to $CO_n$, and the NOR gate 1 (third driving means, first drive signal generating means and a first logic circuit), a programmable NAND gate 5 (third logic circuit), a NOR gate 6 (fourth logic circuit), and an AND gate 7 (fifth logic circuit). All of the columns $CO_1$ to $CO_m$ have the same structure, and therefore only the description of the column $CO_1$ is given here.

The column $CO_1$ includes a plurality of memory cells MC, a pair of bit lines B and $\overline{B}$, the transistors TN5, TN6 and TN7 for pulling up the bit lines B and $\overline{B}$ when the semiconductor memory device is in a standby state, the transistors TN1 and TN2 for preventing stored data from being lost, the column decoder CD, the inverter INV, and the CMOS transfer gates TG1 and TG2 for selecting a column.

The memory cell MC of a static type shown in FIGS. 3 to 5 is used.

In the column $CO_1$, the INHIBIT NAND gate 2 used in the column $C_1$ (see FIG. 1) of the first embodiment is not provided, and the transistors TN1 and TN2 are switched between on and off by a gate signal G2 output from the AND gate 7. Except for theses differences, the column $CO_1$ has the same structure as that of the column $C_1$ of the first embodiment.

A block address BA is input to the programmable NAND gate 5 to select a block. The programmable NAND gate 5 is a logic circuit programmed to output a low state of a block selection sub-signal BS' only when its own block address BA is input. Namely, the block address selection sub-signal BS' goes low when the block is selected, while it goes high when the block is not selected.

The block selection sub-signal BS' and the redundant-block enable signal RE are input to the NOR gate 6. The NOR gate 6 is a logic circuit which outputs the high state of a block selection signal BS only when both of the input signals BS' and RE are low.

The block selection signal BS and the write signal WR are input to the AND gate 7. The AND gate 7 is a logic circuit which outputs the high state of the gate signal G2 (second drive signal) only when both of the input signals BS and WR are high. The write signal WR goes high when a write operation is performed, and goes low when the write operation is not performed.

The gate signal G2 from the AND gate 7 is supplied to the transistors TN1 and TN2 in the blocks $BL_1$ to $BU_m$.

The programmable NAND gate 5, the NOR gate 6 and the AND gate 7 form second drive signal generating means. The second drive signal generating means in all of the regular blocks together form fourth driving means.

Figure 7:
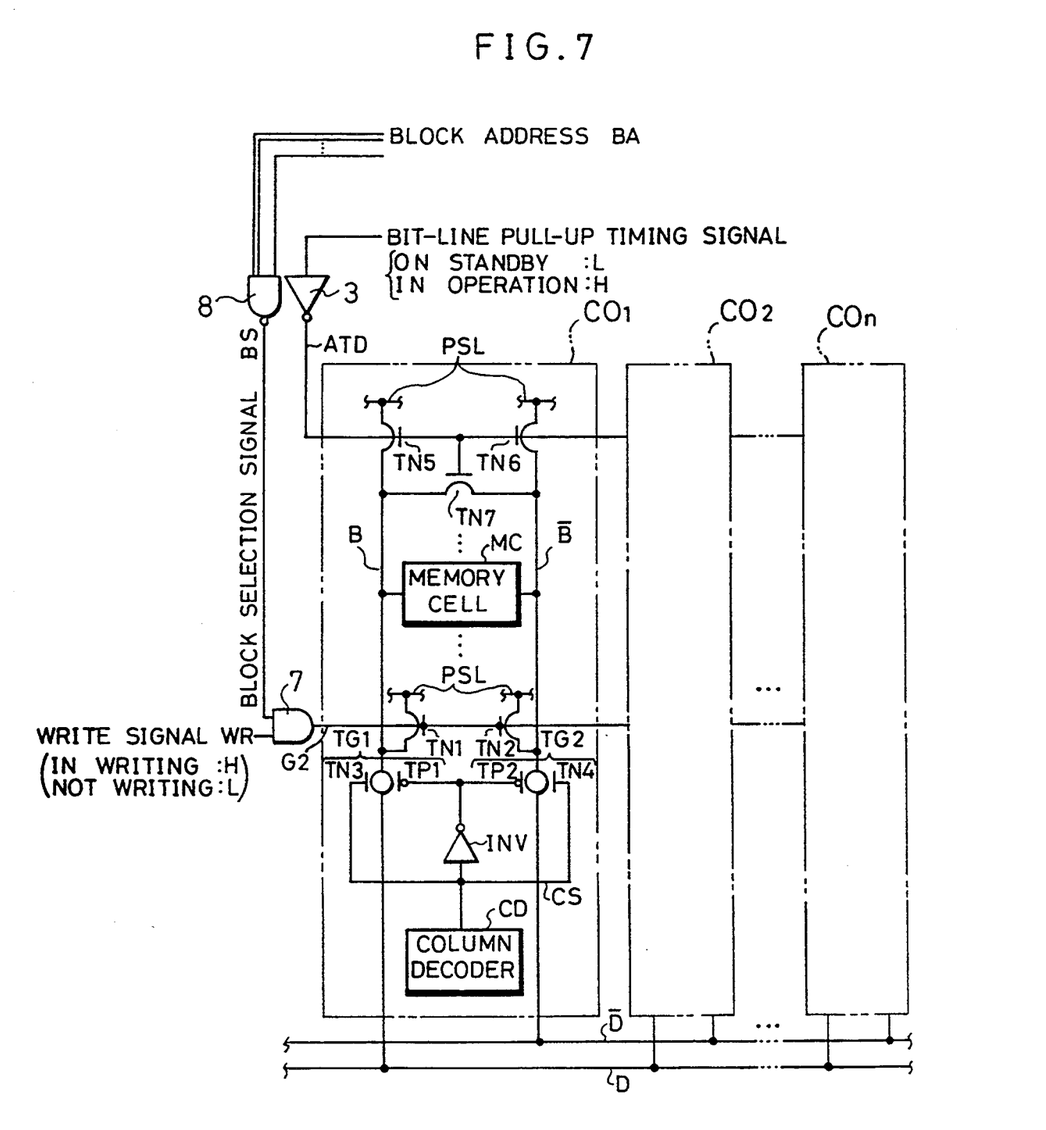
FIG. 7 is an electronic circuit diagram illustrating the structure of a redundant block in the semiconductor memory device.

FIG. 7 illustrates the structure of the redundant block $BL_{re}$. The redundant block $BL_{re}$ includes a plurality of columns $CO_1$ to $CO_n$, an inverter 3, an AND gate 7, and a programmable AND gate 8.

A block address BA is input to the programmable AND gate 8. The programmable AND gate 8 is a logic circuit programmed to output the high state of a block selection signal BS only when its own block address BA is input.

The redundant block $BL_{re}$ uses the inverter 3 for outputting the gate signal ATD instead of the NOR gate 1 used in the regular block $BL_1$, and uses the programmable AND gate 8 instead of the programmable NAND gate 5 and the NOR gate 6 used in the regular block $BL_1$. Except for these differences, the redundant block $BL_{re}$ has the same structure as that of the regular block $BL_1$, and therefore the explanation thereof is omitted.

The following description explains a case where a fault develops in a block among the regular blocks $BL_1$ and $BL_m$ of the above-mentioned structure.

In this case, the high state of the redundant-block enable signal RE is always input to the faulty block, while the low state of the redundant-block enable signal RE is always input to other regular blocks.

In the faulty block, since the high state of the redundant-block enable signal RE is always input to the NOR gate 1 and the NOR gate 6, the gate signal ATD and the block selection signal BS always go low independent of the states of the timing signal BPUT and the block address BA. Accordingly, the AND gate 7 always outputs the low state of the gate signal G2. As a result, transistors TN5, TN6 and TN7 (for pulling up bit lines in a standby state) and transistors TN1 and TN2 (for pulling up bit lines to prevent data from being lost) always become off, cutting off a supply of currents to the bit lines B and $\overline{B}$. With this structure, even when such a faulty block is produced due to a short circuit between the bit lines B and $\overline{B}$ and the ground potential section, the semiconductor memory device is saved from becoming defective.

The following description explains a normal block. In the normal block, the low state of the redundant-block enable signal RE is always input to the NOR gate 1 and the NOR gate 6.

When the semiconductor memory device is in the standby state, the low state of the timing signal BPUT is input to the respective blocks, and therefore the gate signal ATD output from the NOR gate 1 goes high. As a result, the transistors TN5, TN6 and TN7 in the columns $CO_1$ to $CO_n$ are turned on, and the bit lines B and $\overline{B}$ are pulled up. Since the low state of the write signal WR is input to each block, the gate signal G2 output from the AND gate 7 goes low. This causes the transistors TN1 and TN2 to be turned off.

When reading out data, since the timing signal BPUT goes high, the gate signal ATD output from the NOR gate 1 becomes low. Consequently, the transistors TN5, TN6 and TN7 in the columns $CO_1$ to $CO_n$ are turned off. Moreover, since the write signal WR goes low, the gate signal G2 becomes low, turning off the transistors TN1 and TN2. Therefore, a voltage is applied to the bit lines B and $\overline{B}$ only from a selected memory cell MC. Thus, a potential difference sufficient for reading out data appears in the bit lines B and $\overline{B}$ of the selected column.

When writing data, since the timing signal BPUT goes high, the transistors TN5, TN6 and TN7 in the columns $CO_1$ to $CO_n$ are turned off like in the read operation. In the selected block, since the block selection sub-signal BS' output from the programmable NAND gate 5 becomes low, the block selection signal BS output from the NOR gate 6 goes high. Moreover, since the write signal WR goes high, the gate signal G2 becomes high. As a result, the transistors TN1 and TN2 in the columns $CO_1$ to $CO_n$ are turned on, and the bit lines B and $\overline{B}$ are pulled up. This structure restrains an increase in the amount of noise appearing in the bit lines B and $\overline{B}$ of the unselected column when writing data, thereby preventing the data stored in the memory cell MC from being lost.

The semiconductor memory device includes the write driver 10 for outputting to selected bit lines B and $\overline{B}$ a data signal for writing data in the memory cell MC through the data lines D and $\overline{D}$. The write driver 10 includes a transistor for starting or stopping the outputting of the data signal.

As described above, in a read operation, since the bit lines B and $\overline{B}$ in the selected block are pulled up by the transistors TN1 and TN2, the transistors of the write driver 10 have an increased driving power compared with the driving power of the transistors TN1 and TN2 so as to enable writing data.

Additionally, as the consumption of power (leakage direct current) is restrained, the driving power of the transistors TN1 and TN2 becomes considerably lower than that of the drive transistors (TAN3 and TAN4, TBN3 and TBN4, or TCN3 and TCN4) in the memory cell.

In the semiconductor memory device of the first embodiment, a short circuit between the bit lines and the ground potential section is prevented by providing a NOR gate in each block and an INHIBIT NAND circuit 2 in each column. On the other hand, in the semiconductor memory device of the second embodiment, the same effect is obtained by simply providing four logic circuits (NOR gate 1, programmable NAND gate 5, NOR gate 6 and AND gate 7) in each block, achieving a simplified circuit.

As described above, the semiconductor memory device of this embodiment includes:

a plurality of memory cells for storing data;

at least one redundant block having strings of the memory cells arranged in a predetermined direction; and a plurality of regular blocks having strings of the memory cells arranged in the predetermined direction, wherein, when there is a faulty block among the regular blocks, the redundant block is used instead of the faulty block, and wherein each string of the memory cells in the regular blocks includes:

a pair of bit lines, connected to a plurality of the memory cells, for transmitting signals read out from the memory cells and signals to write data in the memory cells;

first pull-up switching means for starting or stopping pulling-up of the bit lines; and second pull-up switching means for starting or stopping pulling-up of the bit lines to prevent data stored in the memory cells from being lost, the semiconductor memory device further including:

third driving means for driving the first pull-up switching means so that the first pull-up switching means in a faulty regular block is always turned off, and that the first pull-up switching means in a normal regular block is turned on in a standby state and turned off when reading or writing data; and fourth driving means for driving the second pull-up switching means so that the second pull-up switching means in a faulty regular block is always turned off, the second pull-up switching means in a normal regular block is turned off in a standby state or in reading out data, and that the second pull-up switching means in a selected normal regular block is turned on and the second pull-up switching means in an unselected normal regular block is turned off when writing data.

With this structure, in the faulty block, both of the first pull-up switching means and the second pull-up switching means are turned off, and therefore a supply of currents to the bit lines are cut off. Thus, even when a block becomes faulty due to a short circuit between the bit lines and the ground potential section, the semiconductor memory device is saved from becoming defective.

On the other hand, in a normal block, the bit lines are not pulled up when reading out data. Therefore, only the voltage of the signal read out from a memory cell is applied to the bit lines of a selected string of memory cells, and a potential difference sufficient for reading out data appears between the bit lines. Namely, the read operation is not affected. Meanwhile, when writing data, the bit lines of the selected block are pulled up. With this structure, it is possible to restrain an increase in the amount of noise on the bit lines of an unselected string of the memory cells in the selected block when writing data, preventing the data stored in the memory cells from being lost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device of this embodiment includes:

a plurality of memory cells for storing data;

at least one redundant block having strings of the memory cells arranged in a predetermined direction; and a plurality of regular blocks having strings of the memory cells arranged in the predetermined direction, wherein, when there is a faulty block among the regular blocks, the redundant block is used instead of the faulty block, and wherein each string of the memory cells in the regular blocks includes:

a pair of bit lines, connected to a plurality of the memory cells, for transmitting signals read out from the memory cells and signals to write data in the memory cells;

first pull-up switching means for starting or stopping pulling-up of the bit lines; and second pull-up switching means for starting or stopping pulling-up of the bit lines to prevent data stored in the memory cells from being lost, said semiconductor memory device further comprising:

first driving means for driving said first pull-up switching means so that said first pull-up switching means in a faulty regular block is always turned off, and that said first pull-up switching means in a normal regular block is turned on in a standby state and is turned off when reading or writing data; and second driving means for driving said second pull-up switching means so that said second pull-up switching means in a faulty regular block is always turned off, and that said second pull-up switching means in a selected string of the memory cells in a normal regular block is turned off and said second pull-up switching means in an unselected string of the memory cells in the normal regular block is turned on when reading or writing data.

2. The semiconductor memory device according to claim 1, wherein said first pull-up switching means includes:

a power supply line having a high state; and a first switching element, located between said power supply line and said bit lines, for connecting or disconnecting the power supply line and the bit lines.

3. The semiconductor memory device according to claim 2, wherein said first pull-up switching means further includes:

a second switching element, located between the pair of bit lines, for connecting or disconnecting the bit lines.

4. The semiconductor memory device according to claim 3, wherein said first switching element and said second switching element are transistors.

5. The semiconductor memory device according to claim 1, wherein said second pull-up switching means includes:

a high state of a power supply line; and a third switching element, located between the power supply line and the bit lines, for connecting or disconnecting the power supply line and the bit lines.

6. The semiconductor memory device according to claim 5, wherein said third switching element is a transistor.

7. The semiconductor memory device according to claim 1, further comprising:

bit-line pull-up timing signal outputting means for transmitting to each block a bit-line pull-up timing signal which has different states in a standby state and in an operation; and redundant-block enable signal outputting means for transmitting to each block a redundant-block enable signal which has different states depending on whether a target block to which the signal is transmitted has a fault, wherein said first driving means includes first drive-signal generating means, provided in each regular block, for generating a first drive signal to drive said first pull-up switching means based on the bit-line pull-up timing signal and the redundant-block enable signal.

8. The semiconductor memory device according to claim 7, wherein the bit-line pull-up timing signal becomes a first level when said device is on standby, and becomes a second level when said device operates, the redundant-block enable signal becomes the first level when a target block to Which the redundant-block enable signal is to be output has no fault, and becomes the second level when the target block has a fault, and wherein said first drive-signal generating means is a first logic circuit which outputs the second level of the first drive signal only when both of the bit-line pull-up timing signal and the redundant-block enable signal have the first level.

9. The semiconductor memory device according to claim 8, wherein the first level corresponds to a low state, and the second level corresponds to a high state, and wherein said first logic circuit is a positive logic NOR circuit.

10. The semiconductor memory device according to claim 1, further comprising:

redundant-block enable signal outputting means for transmitting to each block a redundant-block enable signal which has different states depending on whether a target block to which the redundant-block enable signal is to be transmitted has a fault, wherein each string of the memory cells includes timing signal outputting means for outputting a timing signal which has different states depending on whether the string of the memory cells is selected or not; and wherein said second driving means includes second drive-signal generating means for generating a second drive signal for driving said second pull-up switching means depending on the redundant-block enable signal and the timing signal, said second drive-signal generating means being provided in each string of the memory cells.

11. The semiconductor memory device according to claim 10, wherein the redundant-block enable signal becomes a first level when the target block has no fault and goes into a second stage when the target block has a fault, and the timing signal becomes the first level when the target string of the memory cells is selected, and becomes the second level when the target string of the memory cells is not selected, and wherein said second drive-signal generating means is a second logic circuit which transmits the second level of the second drive signal only when the first level of the redundant-block enable signal and the second level of the timing signal are output.

12. The semiconductor memory device according to claim 11, wherein the first level corresponds to a low state, and the second level corresponds to a high state, and wherein said second logic circuit is a positive logic INHIBIT NAND circuit.

13. The semiconductor memory device according to claim 1, wherein each of the memory cells is of a static type including two access transistors, two drive transistors and two load elements.

14. The semiconductor memory device according to claim 13, wherein said load elements are load transistors.

15. The semiconductor memory device according to claim 13, wherein said load elements are load resistors.

16. The semiconductor memory device according to claim 13, wherein said load elements are load thin-film transistors.

17. The semiconductor memory device according to claim 13, wherein said second pull-up switching means includes:

a high state of a power supply line;

a pull-up transistor, located between the power supply line and the bit lines, for connecting or disconnecting the power supply line and the bit lines, said pull-up transistor having a driving power lower than than that of said drive transistors in the memory cells.

18. A semiconductor memory device of this embodiment includes:

a plurality of memory cells for storing data;

at least one redundant block having strings of the memory cells arranged in a predetermined direction; and a plurality of regular blocks having strings of the memory cells arranged in the predetermined direction, wherein, when there is a faulty block among the regular blocks, the redundant block is used instead of the faulty block, and wherein each string of the memory cells in the regular blocks includes:

a pair of bit lines, connected to a plurality of the memory cells, for transmitting signals read from the memory cells and signals to write data in the memory cells;

first pull-up switching means for starting or stopping pulling up the bit lines; and second pull-up switching means for starting or stopping pulling-up of the bit lines to prevent data stored in the memory cells from being lost, said semiconductor memory device further comprising:

first driving means for driving said first pull-up switching means so that said first pull-up switching means in a faulty regular block is always turned off, and that said first pull-up switching means in a normal regular block is turned on in a standby state and is turned off when reading or writing data; and second driving means for driving said second pull-up switching means so that said second pull-up switching means in a faulty regular block is always turned off, said second pull-up switching means in a normal block regular block is turned off in the standby state and when reading out data, and that said second pull-up switching means in a selected normal regular block is turned on and said second pull-up switching means in an unselected normal regular block is turned off when writing data.

19. The semiconductor memory device according to claim 18, wherein said first pull-up switching means includes:
a power supply line having a high state; and
a first switching element, located between the power supply line and the bit lines, for connecting the power supply line to the bit lines and disconnecting the power supply line from the bit lines.

20. The semiconductor memory device according to claim 19, wherein said first pull-up switching means further includes:
a second switching element, located between said pair of bit lines, for connecting or disconnecting the bit lines.

21. The semiconductor memory device according to claim 20, wherein said first switching element and said second switching element are transistors.

22. The semiconductor memory device according to claim 18, wherein said second pull-up switching means includes:
a power supply line having a high state; and
a third switching element, located between the power supply line and the bit lines, for connecting or disconnecting the power supply line and the bit lines.

23. The semiconductor memory device according to claim 22, wherein said third switching element is a transistor.

24. The semiconductor memory device according to claim 18, further comprising:
bit-line pull-up timing signal outputting means for transmitting to each block a bit-line pull-up timing signal of different states in a standby state and in an operation; and
redundant-block enable signal outputting means for transmitting to each block a redundant-block enable signal which has different states depending on whether a target block to which the signal is to be transmitted has a fault,
wherein said first driving means includes first drive-signal generating means, provided in each regular block, for generating a first drive signal to drive said first pull-up switching means according to the bit-line pull-up timing signal and the redundant-block enable signal.

25. The semiconductor memory device according to claim 24,
wherein the bit-line pull-up timing signal becomes a first level when said device is on standby, and becomes a second level when said device operates,
the redundant-block enable signal becomes the first level when a target block to which the redundant-block enable signal is to be transmitted has no fault, and becomes the second level when the target block has a fault, and
wherein said first drive-signal generating means is a first logic circuit which outputs the second level of the first drive signal only when both of the bit-line pull-up timing signal and the redundant-block enable signal have the first level.

26. The semiconductor memory device according to claim 25,
wherein the first level corresponds to a low state, and the second level corresponds to a high state, and
wherein said first logic circuit is a positive logic NOR circuit.

27. The semiconductor memory device according to claim 18, further comprising:
redundant-block enable signal outputting means for transmitting to each block a redundant-block enable signal which has different states depending on whether a target block to which the redundant-block enable signal is to be transmitted has a fault;
block-address outputting means for outputting to each block a block address for selecting a block;
write-signal outputting means for transmitting to each block a write signal which has different states depending on whether a write operation is performed,
wherein said second driving means includes second drive-signal generating means for generating a second drive signal for driving said second pull-up switching means depending on the redundant-block enable signal, the block address and the write signal, said second drive-signal generating means being provided in each regular block.

28. The semiconductor memory device according to claim 27,
wherein the redundant-block enable signal becomes a first level when the target block has no fault and becomes a second level when the target block has a fault, and
the write signal becomes the second level when performing a write operation, and becomes the first level when the write operation is not performed, and
wherein said second drive-signal generating means includes:
a third logic circuit which receives the block address and outputs the first level of a block selection sub-signal when its own block address is input and outputs the second level of the block selection sub-signal when a block address other than its own block address is input;
a fourth logic circuit which receives the redundant-block enable signal and the block selection sub-signal, and outputs the second level of the block selection signal only when the both of the input signals have the first level; and
a fifth logic circuit which receives receives the write signal and the block selection signal, and outputs the second level of the second drive signal only when both of the input signals have the second level.

29. The semiconductor memory device according to claim 28,
wherein the first level corresponds to a low state, and the second level corresponds to a high state, and
wherein said third logic circuit is a positive logic programmable NAND circuit, said fourth logic circuit is a positive logic NOR circuit, and said fifth logic circuit is a positive logic NOR circuit.

30. The semiconductor memory device according to claim 18,
wherein each of the memory cells is of a static type including two access transistors, two drive transistors and two load elements.

31. The semiconductor memory device according claim 30,
wherein said load elements are load transistors.

32. The semiconductor memory device according to claim 30, wherein said load elements are load resistors.

33. The semiconductor memory device according to claim 30, wherein said load elements are load thin-film transistors.

34. The semiconductor memory device according to claim 30, wherein said second pull-up switching means includes:

a high state of a power supply line; and a pull-up transistor, located between the power supply line and the bit lines, for connecting or disconnecting the power supply line and the bit lines, said pull-up transistor having a driving power lower than that of said drive transistors in the memory cells.

35. The semiconductor memory device according to claim 18, further comprising a write driver for transmitting to the bit lines a data signal for writing data in the memory cells, wherein said second pull-up switching means includes:

a high state of a power supply line; and a pull-up transistor, located between the power supply line and the bit lines, for connecting or disconnecting the power supply line and the bit lines, and wherein said write driver includes a transistor for starting or stopping the outputting of the data signal, said transistor in said write driver having a driving power greater than that of said pull-up transistor so as to enable writing of data.

* * * * *